(12) United States Patent
Bernard

(10) Patent No.: US 11,289,439 B2
(45) Date of Patent: Mar. 29, 2022

(54) OPTIMISED FABRICATION METHODS FOR A STRUCTURE TO BE ASSEMBLED BY HYBRIDISATION AND A DEVICE COMPRISING SUCH A STRUCTURE

(71) Applicant: COMMISSARIAT À L'ÉNERGIE ATOMIQUE ET AUX ÉNERGIES ALTERNATIVES, Paris (FR)

(72) Inventor: Jeannet Bernard, Grenoble (FR)

(73) Assignee: COMMISSARIAT ÂL'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 132 days.

(21) Appl. No.: 16/723,394

(22) Filed: Dec. 20, 2019

(65) Prior Publication Data
US 2020/0211989 A1    Jul. 2, 2020

(30) Foreign Application Priority Data

Dec. 28, 2018 (FR) ..................................... 1874362

(51) Int. Cl.
*H01L 23/00* (2006.01)
*H01L 33/32* (2010.01)

(52) U.S. Cl.
CPC .............. *H01L 24/11* (2013.01); *H01L 24/16* (2013.01); *H01L 24/83* (2013.01); *H01L 33/32* (2013.01); *H01L 2224/1357* (2013.01); *H01L 2224/13655* (2013.01); *H01L 2224/73204* (2013.01)

(58) Field of Classification Search
None
See application file for complete search history.

(56) References Cited

U.S. PATENT DOCUMENTS

2013/0328013 A1    12/2013    Inazu et al.
2020/0211989 A1*    7/2020    Bernard .................. H01L 24/81

FOREIGN PATENT DOCUMENTS

| WO | 2006054005 A1 | 5/2006 |
| WO | 2009115686 A2 | 9/2009 |
| WO | 2018033689 A1 | 2/2018 |

OTHER PUBLICATIONS

Search Report for French Application No. 1874362 dated Oct. 18, 2019.

* cited by examiner

*Primary Examiner* — Long Pham
(74) *Attorney, Agent, or Firm* — Pearne & Gordon LLP

(57) ABSTRACT

A method of fabrication of a semiconducting structure intended to be assembled to a second support by hybridisation. The semiconducting structure comprising an active layer comprising a nitrided semiconductor. The method comprises a step for the formation of at least one first and one second insert and during this step, a nickel layer is formed in contact with the support surface, and a localised physico-chemical etching step of the active layer, a part of the active layer comprising the active region being protected by the nickel layer.

10 Claims, 6 Drawing Sheets

FIG.9

OPTIMISED FABRICATION METHODS FOR A STRUCTURE TO BE ASSEMBLED BY HYBRIDISATION AND A DEVICE COMPRISING SUCH A STRUCTURE

CROSS-REFERENCE TO RELATED APPLICATIONS

This application claims priority from French Patent Application No. 1874362 filed on Dec. 28, 2018. The content of this application is incorporated herein by reference in its entirety.

TECHNICAL FIELD

The invention relates to the field of semiconducting devices and more particularly optoelectronic devices.

The purpose of this invention is a method of fabricating a semiconducting structure intended to be assembled by hybridisation to a support and a method of fabricating a device comprising a structure and a support to which said structure is assembly by hybridisation.

STATE OF THE ART

Fabrication of some semiconducting devices may require an operation, for example by hybridisation, to make a connection between a semiconducting structure and a special-purpose support. This is the case particularly for optoelectronic devices for which said structure can be made from one or several semiconducting materials called III-V materials and the support is made of silicon, possibly including a control circuit for said structure based on a C-MOS type technology.

It is known, particularly through documents WO 2006/054005 and WO 2009/115686, that such a connection can be made by supplying the structure with inserts and the support with bumps made of a ductile conducting material, the connection being made by the insertion of inserts into said bumps made of a ductile conducting material.

A structure adapted for such a connection, in other words comprising said inserts, is generally fabricated in several collective steps, by which a plurality of structures can be fabricated on the same support, and including individualisation steps comprising in particular:
  local etching of at least one active layer in which the active region of each of the structures is arranged, this etching making it possible to insulate active regions from each other so as to form said structures independently of each other, and
  separation of said structures from the substrate.

When at least one active layer of such a structure comprises a nitrided semiconducting material such as gallium nitride, the local etching step of the at least one active layer necessarily makes use of a particularly abrasive physico-chemical etching process. Therefore the result is that in order to determine the localisation of this etching, an adapted mask such as a relatively thick hard mask made of silicon dioxide or a resin mask has to be used, this mask itself being etched while etching the active layer. Thus, although such a fabrication method enables perfect individualisation of the structures, it nevertheless has the disadvantage that it is relatively complex to implement, since a relatively thick mask has to be used. Furthermore, with such a method of fabricating the structures, structure individualisation steps are decorrelated from positioning of the inserts, therefore there is a serious risk of an alignment problem between delimitation of the structure and the inserts. Therefore, the semiconducting structure has to be oversized to limit this risk.

PRESENTATION OF THE INVENTION

The invention aims to overcome these disadvantages and thus its purpose is to disclose a method of fabricating a semiconducting structure designed to be connected by hybridisation to a support substrate comprising at least one active layer in a nitrided semiconductor, said method being simpler than methods in prior art enabling the formation of such a semiconducting structure, and providing alignment between delimitations of the structure and the inserts.

To achieve this, the invention relates to a method of fabricating a semiconducting structure designed to be connected by hybridisation to a support substrate, said method of fabricating a semiconducting structure including the following steps:
  supply a first support that comprises a substrate and at least one active layer, said active layer comprising at least one nitrided semiconducting material, at least one active region of said semiconducting structure and at least a first and a second connection zone of said active region that is flush with a surface of the first support being arranged in the active layer,
  formation of at least one first and one second insert body in electrical contact with the first and the second connection zones respectively, said formation step including the formation of a nickel layer covering a portion of the surface of the first support, said nickel layer being arranged on the surface of the support at the active region, at least partially covering the first and second connection zones,
  localised physico-chemical etching of the active layer, the localisation of the etching being provided by protecting part of the active layer comprising the active region by the nickel layer,
  physico-chemical etching of the nickel layer, the etching being stopped after release of at least part of the surface of the first support of said nickel layer, the part of the surface of the first support including the surface of the first support outside the first and second connection zones, a remaining portion of the nickel layer and each of the first and second insert bodies enabling the formation of a first and a second insert,
  release of the active layer from the first substrate, said release enabling formation of the semiconducting structure.

In this way, local etching to individualise the structure can provide delimitation of the structure that is aligned with the inserts. It is the nickel layer that is included in the inserts that acts as a mask during this localised etching.

Furthermore, since nickel has a relatively low or practically zero etching rate under physico-chemical etching processes used to etch nitrided semiconducting materials, there is no need for this layer to be thick as is the case for the etching mask used to etch the active layer in prior art. Since this same nickel layer participates in formation of the insert, the removal of unnecessary portions of said layer made by physico-chemical etching enables formation of the first and second inserts. Thus, unlike prior art, the step to remove the mask used during local etching of the active layer is fully useful, because it participates in the formation of inserts. Therefore the result is that the manufacturing method according to the invention is simpler than methods known in prior art.

The terms "conductor" and "insulator", when used above and in the remainder of this document, must be understood as meaning "electrical conductor" and "electrical insulator".

The step in which the first and second inserts are formed can comprise the following sub-steps:
  formation of at least a first and a second portion of a metallic layer covering the first and second connection zones respectively,
  formation of a first and a second insert body in contact with the first and second metallic layer portions, respectively,
  deposition of the nickel layer in contact with the support surface of the first and second portions of metallic layer and the first and second insert bodies, the nickel layer forming a coating of the first and second insert bodies.

In this way, the nickel layer forms a coating on the insert bodies, by participating in the formation of said inserts, and also an etching mask to release the active layer for singularisation of said semiconducting structure. Such singularisation is particularly advantageous in the framework of parallel structure fabrication according to the invention.

The step in which the first and second insert bodies are formed can comprise the following sub-steps:
  formation of at least a first and a second portion of a metallic layer covering the first and second connection zones respectively,
  deposition of the nickel layer covering the support surface that is free of the first and second metallic layer portions and said first and second metallic layer portions,
  formation of a first and a second insert body in contact with the nickel layer at the first and second metallic layer portions, respectively.

In this way, the nickel layer participates in formation of the base of each of the inserts.

The first and the second insert layers may comprise nickel.

In this way, and in a manner similar to the nickel layer, the first and second insert bodies are not etched or are only slightly etched during the localised physico-chemical etching step of the active layer.

The first and the second insert bodies may include a carbide from among silicon carbide and tungsten carbide.

Due to their hardness, such materials are particularly well adapted to connection by hybridisation of the semiconducting structure to a second support.

The active layer may include a gallium nitride.

The method according to the invention is particularly suitable for such a material in the active layer.

The active part of the semiconducting structure may be a diode, the first and second connection zones corresponding to metallic contacts of the anode and the cathode respectively of said diode.

The active layer may comprise:
  a first active sub-layer with a first type of conductivity, the second connection zone being a connection zone of said first active sub-layer,
  an active zone adapted to emit light, said active zone preferably comprising at least one quantum well,
  a second active sub-layer with a second type of conductivity opposite the first type of conductivity, the first connection zone being a connection zone of said second active sub-layer, The invention also relates to a method of fabricating a device comprising a semiconducting structure, the method including the following steps:
  formation of a semiconducting structure using a fabrication method according to the invention,
  supply of a second support comprising at least a third and a fourth connection zone corresponding to the first and second connection zone of the semiconducting structure, and a first and second bump made of a ductile conducting material in electrical contact with the third and the fourth connection zones respectively,
  connection of the first and second connection zones with the third and fourth connection zones respectively by insertion of the first and second inserts in the first and second bumps made of a ductile conducting material, respectively.

Such a fabrication method benefits from advantages related to a step to supply a semiconducting structure conforming with the fabrication method according to the invention.

The semiconducting structure is a light emitting diode, the second support comprising a control circuit adapted to supply and control said light emitting diode.

BRIEF DESCRIPTION OF THE DRAWINGS

This invention will be better understood after reading the description of example embodiments given purely for information and that are in no way limitative, with reference to the appended drawings on which.

The different parts shown on the figures are not necessarily all at the same scale, to make the figures more easily understandable.

The different possibilities (variants and embodiments) must be understood as not being mutually exclusive and can be combined with each other.

DETAILED PRESENTATION OF PARTICULAR EMBODIMENTS

Figure 1:
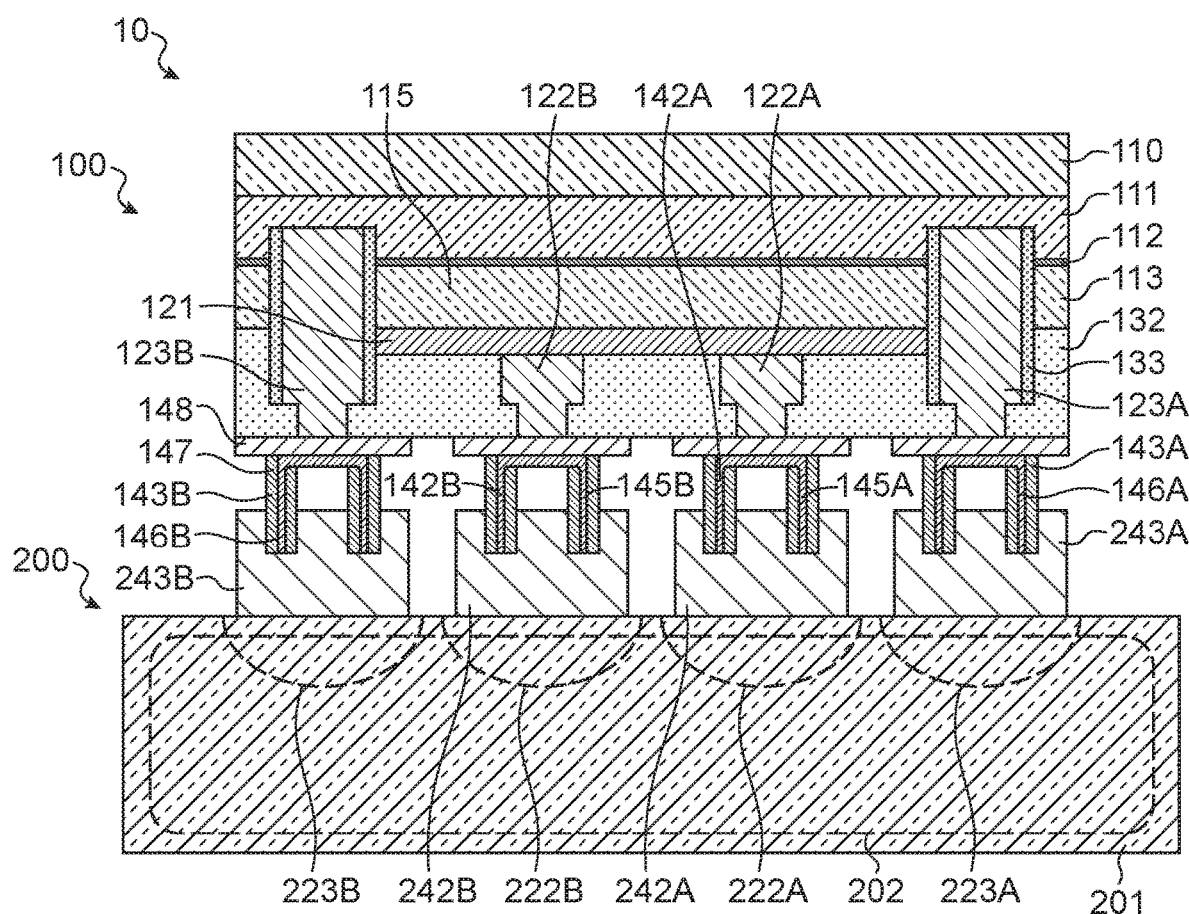
FIG. 1 is a sectional view of a device according to a first embodiment of the invention, the device comprising a structure assembled by hybridisation on a control support.

FIG. 1 is a lateral sectional view illustrating a semiconducting device 10 such as an optoelectronic device that can be obtained by means of a fabrication method according to the invention, said device comprising a semiconducting structure 100 such as an optoelectronic structure, assembled by hybridisation to a support 200, such as a control support, called the second support 200.

In a usual application of the invention, the semiconducting structure 100 is an optoelectronic structure. More precisely, in the framework of the first and second embodiment described below, corresponding to an example application of the invention, the semiconducting structure 100 is a light emitting diode. Obviously, this example application is in no way limitative, the invention covers all types of semiconducting structure for example such as semiconducting structures adapted to detect electromagnetic radiation, and particularly photodiodes.

Such a semiconducting device thus comprises the semiconducting structure 100 and the support 200 assembled to said semiconducting structure 100.

The semiconducting structure comprises, as illustrated on FIG. 1:
- an adaptation layer 110, presenting a first and a second face,
- a first active sub-layer 111 with a first and a second face, the first active sub-layer covering the second face of the adaptation layer 110 with its first face in contact with the second face of the adaptation layer 110,
- an active zone 112 comprising at least one first quantum well, the active zone 112 covering the second face of the first active sub-layer 111 having its second face in contact with the second face of the first active sub-layer 111,
- a second active sub-layer 113 with a first and a second face, the second active sub-layer 113 covering the second face of the active zone 112 having its first face in contact with the second face of the active zone 112,
- a first metallic layer 121 covering a first portion of the second active sub-layer 113, the first metallic layer 121 having a first and a second face and covering said first portion of the second active sub-layer 113 being in contact with the second face of the second active sub-layer 113,
- an insulating layer 131, 132 covering the first metallic layer 121 and the part of the second active sub-layer 113 that is free of the first metallic layer 121, the insulating layer 131, 132 having a first and a second face and the insulating layer 131, 132 covering the second face of the first metallic layer 121 and the second face of the second active sub-layer 113 that is free of the first metallic layer 121 being in contact with said second faces through its first face, the second face of the insulating layer 131, 132 forming a surface of the semiconducting structure 100,
- a first and a second metallic via 122A, 122B extending from the first metallic layer 121 through the insulating layer 131, 132 opening up at the surface of the insulating layer 131, 132 to form a first and a second first connection zone,
- a third and a fourth metallic via 123A, 123B, extending from the first active layer 111 through the active zone 112, the second active layer 113 and the insulating layer 132 opening up on the surface of said insulating layer 132 to form a first and a second connection zone of said semiconducting structure 100, each of the third and the fourth metallic vias 123A, 123B having an insulating coating 133 arranged to electrically insulate them from at least the second active sub-layer 113,
- a first and a second first insert 142A, 142B in contact with the first and second first connection zones 122A, 122B respectively,
- a first and a second second insert 143A, 143B in contact with the first and second second connection zones 123A, 123B respectively, In such a structure, the first active sub-layer, the active zone and the third active sub-layer together form an active layer 111, 112, 113 of said semiconducting structure 100 comprising at least one nitrided semiconductor.

Such a nitrided semiconductor is an III-V semiconductor comprising nitrogen as the element. Thus, such a nitrided semiconductor can be a binary alloy such as an aluminium nitride AlN, a gallium nitride GaN or an indium nitride InN, or a ternary alloy such as a gallium arsenide nitride GaAsN, an aluminium gallium nitride AlGaN or an indium gallium nitride InGaN, or a quaternary alloy such as aluminium gallium arsenide nitride AlGaAsN or an indium gallium arsenide nitride InGaAsN. In a preferred application of the invention, the nitrided semiconductor is a gallium nitride, the first and second active sub-layers 111, 113 being composed of such a semiconductor and the active zone 113 then being chosen as a function of the range of emission wavelengths chosen for the semiconducting structure 100.

Figure 2:
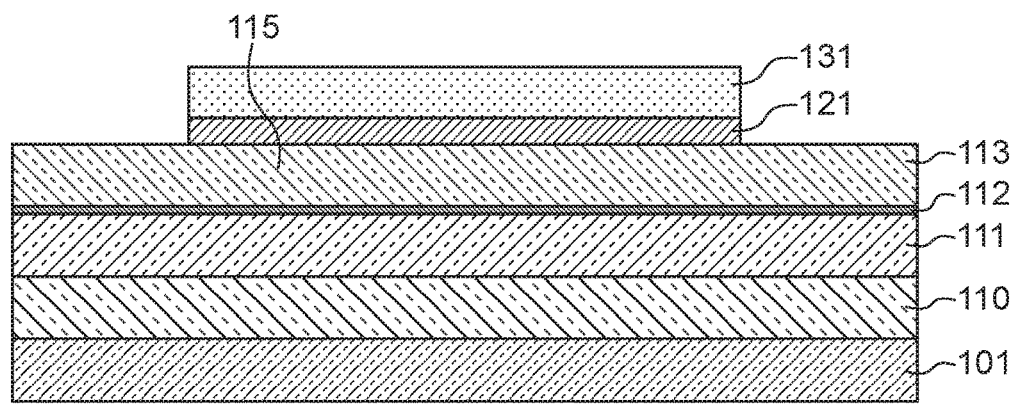
FIG. 2 is a sectional view of a first step in a method of fabrication of the structure in FIG. 1.

Furthermore, due to the method of supply of the active layer 111, 112, 113 according to this first embodiment of the invention, the composition of the adaptation layer 110 is chosen so as to enable an adaptation of the crystalline network between the active layer 111, 112, 113, in other words the first active sub-layer 111 and the first substrate 101, illustrated particularly on FIG. 2, on which it is formed. It will be noted that according to the preferred application of the invention in which the first active sub-layer is made from a gallium nitride GaN, said first substrate being a silicon Si substrate, the adaptation layer 110 may be a buffer layer of gallium nitride GaN with a thickness of between 1 nm and 500 nm, or even between 5 nm and 100 nm.

In order to form a light emitting diode, the first active sub-layer 111 has a first type of conductivity, and the second active sub-layer 113 has a second type of conductivity opposite the first type of conductivity. Thus for example, the first active sub-layer 111 may be N doped, the second active sub-layer then being P doped. In the preferred application of the invention, namely a first and a second layer of gallium nitride GaN. For example in the context of such a preferred application, the thickness of the first active sub-layer 111 is between 100 nm and 3 μm, for example of the order of 700 nm. According to this same example, the thickness of the second active sub-layer 113 is between 50 nm and 300 nm, for example of the order of 100 nm.

The active zone 112 is a zone practically free of carriers and comprising at least one quantum well, and preferably a plurality of quantum wells. The active zone may for example be composed of a stack of one or several emissive layers each forming a quantum well, for example based on at least one among gallium nitride GaN, indium nitride InN, indium gallium nitride InGaN, aluminium gallium nitrides AlGaN, aluminium nitride AlN, aluminium indium gallium nitrides AlInGaN, gallium phosphorus GaP, aluminium gallium phosphorus AlGaP, aluminium indium gallium phosphorus AlInGaP, or a combination of one or several of these materials. As a variant, the active zone may be a layer of intrinsic gallium nitride GaN, in other words not intentionally doped, for example with a concentration of residual donors equal to between $10^{15}$ and $10^{18}$ atoms/cm³, for example of the order of $10^{17}$ atoms/cm³. Such quantum wells may for example be supplied by a stack of indium gallium nitride layers $In_XGa_{1-X}N$/gallium nitride GaN, where X is selected from within the range varying from 0 to 1, excluding 0 and 1 and being chosen as a function of the chosen wavelengths range, in compliance with general knowledge of an expert in the business. Similarly, the thicknesses of said layers of the stack are adapted in accordance with the general knowledge of a skilled person in the art, as a function of the chosen wavelengths range.

It will be noted that as an example, the thickness of the active zone 112 can be between 10 nm and 200 nm, for example of the order of 100 nm.

It will be noted that according to the preferred application, as a variant, the active zone can include quantum boxes for which the dimensions and the composition are adapted as a function of the chosen wavelengths range.

It will be noted that in any case, and according to the principle of the invention, at least one among the first and the second active sub-layers 111, 113 and the active zone 112 comprises at least one nitrided semiconductor, such as gallium nitride GaN or one among gallium nitride GaN, indium nitride InN, indium gallium nitride InGaN, aluminium gallium nitrides AlGaN, aluminium nitride AlN, aluminium indium gallium nitrides AlInGaN.

The first metallic layer 121 is adapted to form a resistive contact with the second active sub-layer 113. Thus, according to a preferred application of the invention and in the case in which the second sub-layer is P doped, the first metallic layer may for example be formed by a stack comprising a first sub-layer of indium In and a second sub-layer of silver Ag or a stack comprising a first sub-layer of indium tin oxide (ITO) and corresponding to a mixture of indium oxide $In_2O_3$ and tin oxide $SnO_2$, and a second sub-layer of silver Ag. The first metallic layer may for example be between 1 nm and 5 µm thick, or even between 5 nm and 1 µm or even between 50 nm and 500 nm The first metallic layer is arranged to leave part of the surface of the second sub-layer 113 free so as to authorise a passage for the third and the fourth vias 123A, 1238, without the risk of a short circuit.

The insulating layer 132, can be made of silicon dioxide $SiO_2$ or silicon nitride $Si_2N_3$.

The adaptation layer 110, the first active sub-layer 111, the active zone 112 the second active sub-layer 113, the metallic layer 121, the insulating layer 132 together form a first support 101, 110, 111, 112, 113, 121, 131.

The third and the fourth metallic vias 123A, 123B extend through the active layer 112, the second active sub-layer 113 and the insulating layer 132. The third and the fourth metallic vias 123A, 123B are made from a conducting material adapted to form a resistive contact with the material of the first active sub-layer 111. Thus, according to the preferred application of the invention, if the first active sub-layer 111 is N doped, the third and the fourth metallic vias 123A, 123B may include a bond layer in contact with the titanium Ti/titanium nitride TiN insulating layer and a core made of copper Cu.

Each of the third and fourth metallic vias 123A, 123B is insulated from the active zone 112 and from the active sub-layer 113 by the insulating coating 133 interposed between said via and said active zones 112 and the second active sub-layer 113. The insulating coating 133 may be alumina $Al_2O_3$.

The first and the second metallic vias 122A, 122B extend through the insulating layer 131, 132, in contact with the first insulating layer 121. According to this first embodiment, the first and the second metallic vias 122A, 122B are made from the same metallic material as the third and the fourth metallic vias 123A, 123B. Thus, according to the preferred application of the invention, the first and the second first vias 122A, 122B may include a bond layer in contact with the titanium Ti/titanium nitride TiN insulating coating and a core made of copper Cu.

The first and second metallic vias 122A, 122B and the third and fourth metallic vias 123A, 123B are flush with the surface of the insulating layer and therefore of the semiconducting structure 100. The first and second metallic vias 122A, 122B thus form the first connection zone and the third and fourth metallic vias 123A, 123B form the second connection zone.

The first and second connection zones are in contact with the first and second first inserts 142A, 142B and the first and the second second inserts 143A, 143B respectively. Each of the first and second first inserts 142A, 142B and the first and second second inserts 143A, 143B, comprise:
  a portion of the second metallic layer 148 covering the corresponding connection zone,
  an insert body 145A, 145B, 146A, 146B,
  a nickel layer 147 partially covering the insert body 145A, 145B, 146A, 146B.

Each of the portions of the second metallic layer 148 extends beyond the connection zone covering part of the surface of the insulating layer 131 and at a distance from each other. In the framework of the preferred application of the invention, the second metallic layer 148 may be a layer of titanium nitride TiN.

The insert body 145A, 145B, 146A, 146B of each of the first and second first inserts 142A, 142B and of each of the first and second second inserts 143A, 143B, has the shape of a hollow cylinder of revolution, the base opposite the portion of the corresponding second metallic layer 148 being missing.

Obviously, such a hollow cylindrical shape of the insert body 145A, 145B, 146A, 146B is only given as an example, the insert body 145A, 145B, 146A, 146B of each of the first and second first inserts 142A, 142B and of each of the first and second second inserts 143A, 143B can be of another shape, such as a rod or a wall, without going outside the framework of the invention.

According to the preferred application of the invention, the insert body 145A, 145B, 146A, 146B of each of the first and second first inserts 142A, 142B and of each of the first and second second inserts 143A, 143B, can include a stack of layers comprising a first titanium layer Ti, a second titanium nitride layer TiN and a third silicon carbide layer WSi, said layers succeeding each other from the outside of said cylindrical shape towards the inside of this shape.

As a variant, the insert body 145A, 145B, 146A, 146B of each of the first and second first inserts 142A, 142B and of each of the first and second second inserts 143A, 143B, can include a single material selected from the group comprising copper Cu, titanium Ti, tungsten W, chromium Cr, nickel Ni, platinum Pt, palladium Pd and alloys thereof such as tungsten silicide WSi, tungsten nitride WN and nickel nitride TiN.

The insert body is covered by the nickel layer 147 on these lateral walls, in other words walls approximately perpendicular to the surface of the first insulating layer 131, 132.

The second support 200 comprises the following, as illustrated on FIG. 1:
  a second substrate 201 in which a control circuit 202 of the semiconducting structure 100 is arranged, said control circuit 202 having, in a similar manner to the semiconducting structure 100, a first and a second third connection zone 222A, 222B, corresponding to the first and second first connection zone 122A, 122B of the semiconducting structure 100, and a first and second fourth connection zone 223A, 223B corresponding to the first and second second connection zone 123A, 123B of the semiconducting structure 100, said first and second third connection zones 222A, 222B and first and second fourth connection zones 223A, 223B being flush with the surface of the second support 200, a first and a second first bump made of a ductile conducting material 242A, 242B in contact with the first and second third connection zones 222A, 222B respectively, a first and a second second bump made of a ductile conducting material 243A, 243B in contact with the first and second fourth connection zones 223A, 223B respectively.

In a usual configuration of the invention, the second support 201 is made from a semiconducting material other than the material used for the active layer 111, 112, 113. The second support 201 is thus preferably adapted for the formation of a control circuit and can thus be made from a semiconducting material among silicon Si, germanium Ge and silicon carbide SiC. In the preferred application, the second support 201 is made of silicon Si.

The control circuit 202 is a classical control circuit such as a circuit based on the CMOS technology. Since such control circuits 202 are known to a skilled person in the art, they will not be described more precisely in this document.

The control circuit 202 presents the first and the second third connection zones 222A, 222B and the first and second fourth connection zones 223A, 223B.

The first and second first bumps made of a ductile conducting material 242A, 242B, and the first and second second bumps made of a ductile conducting material 243A, 243B may comprise one among indium In, tin Sn, aluminium Al and one of its alloys such as lead-tin alloys SnPb and copper-silver-tin SnAgCu or aluminium-copper AlCu alloys.

As shown in FIG. 1, the semiconducting structure 100 is assembled by hybridisation to the second support 200, with first inserts 142A, 142B embeded into the corresponding first bumps made of a ductile conducting material 242A, 242B and second inserts 143A, 143B embedded in the second bumps made of a ductile conducting material 243A, 243B.

Obviously, this semiconducting structure 100 and this second support 100 are described with reference to FIG. 1 that represents a lateral sectional view of said semiconducting structure 100 and said second support 200. Although all that are shown on this figure, and therefore described above, are one first and second first connection zone, one first and second second connection zone, one first and second first insert 142A, 142B, one first and second second insert 143A, 143B, a semiconducting structure 100 and a second support 200 according to the invention general comprises more. In compliance with this first embodiment, the semiconducting structure 100 comprises four first connection zones and the same number of first inserts 142A, 142B on a central part, and twelve second connection zones and the same number of second inserts 143A, 143B on a peripheral part. Obviously, in order to enable assembly of the semiconducting structure 100 and the second support 200, the second support 200 has a similar configuration, with a corresponding number of third connection zones 222A, 222B and fourth connection zones 223A, 223B.

It will be noted that this first embodiment is obviously only one example embodiment of the invention, and that the semiconducting structure 100 can have an arbitrary number of said first and second connection zones 122A, 122B, 123A, 123B, of said first and second inserts 142A, 142B, 143A, 143B without going outside the framework of the invention.

Figure 3:
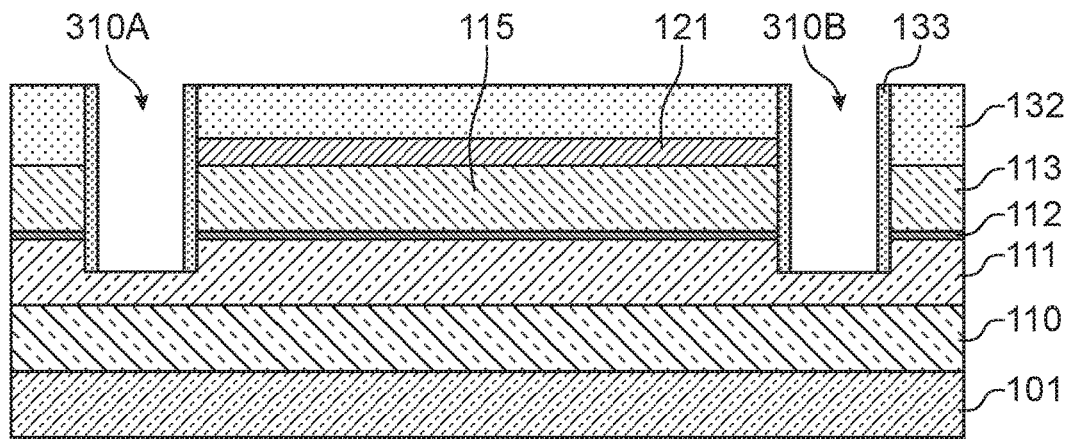
FIG. 3 is a sectional view of a second step in a method of fabrication of the structure in FIG. 1.
Figure 4:
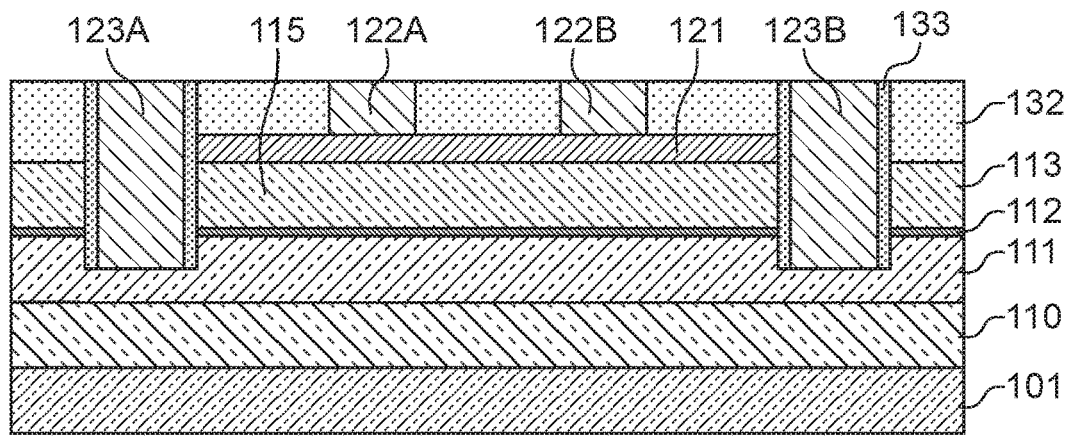
FIG. 4 is a sectional view of a third step in a method of fabrication of the structure in FIG. 1.
Figure 5:
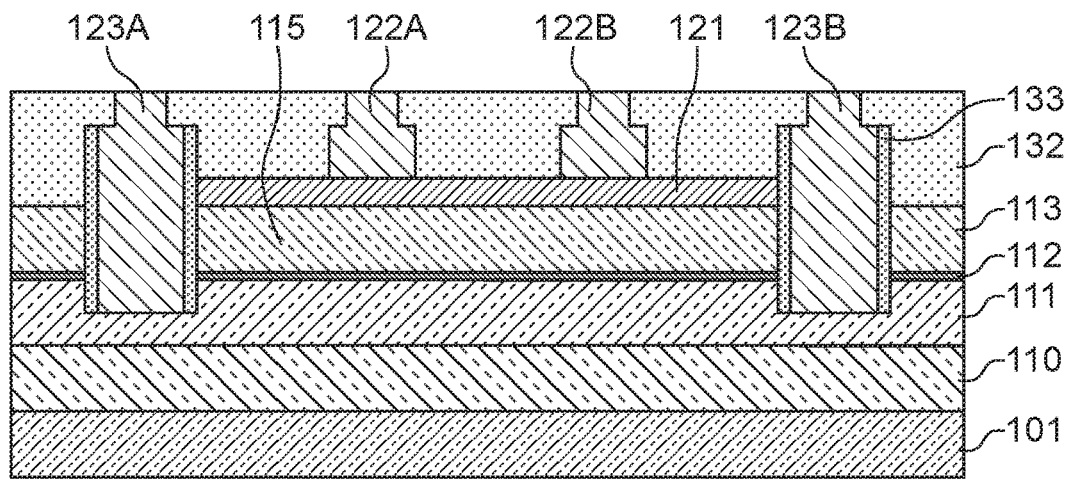
FIG. 5 is a sectional view of a fourth step in a method of fabrication of the structure in FIG. 1.
Figure 6:
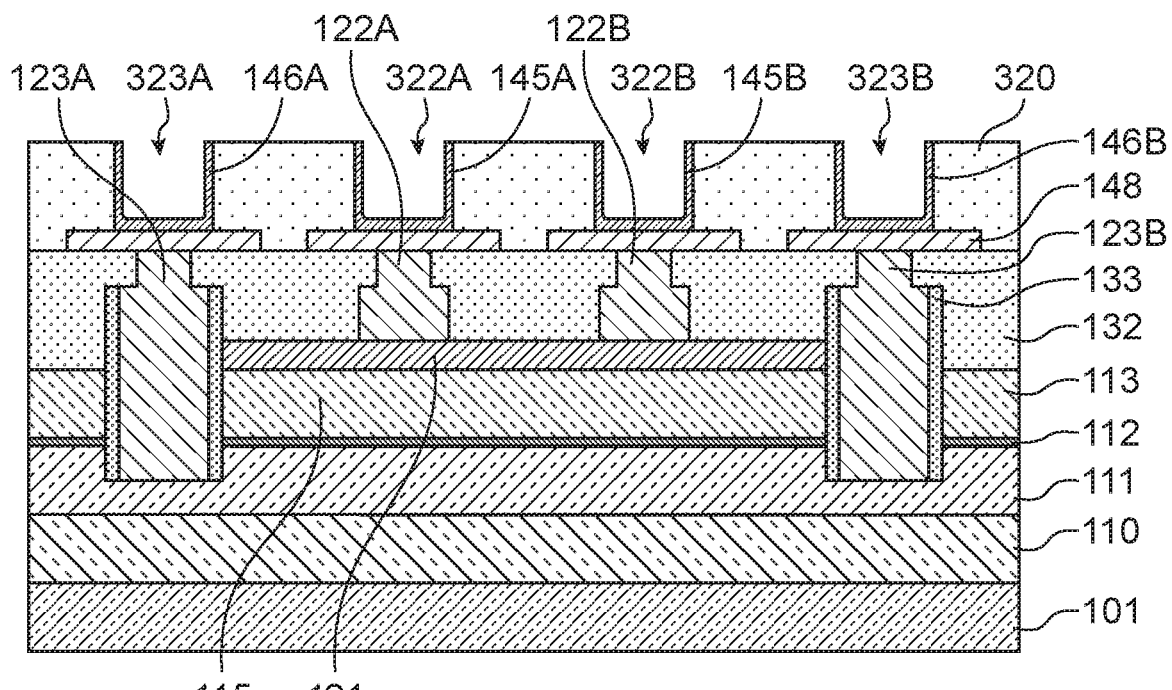
FIG. 6 is a sectional view of a fifth step in a method of fabrication of the structure in FIG. 1.
Figure 7:
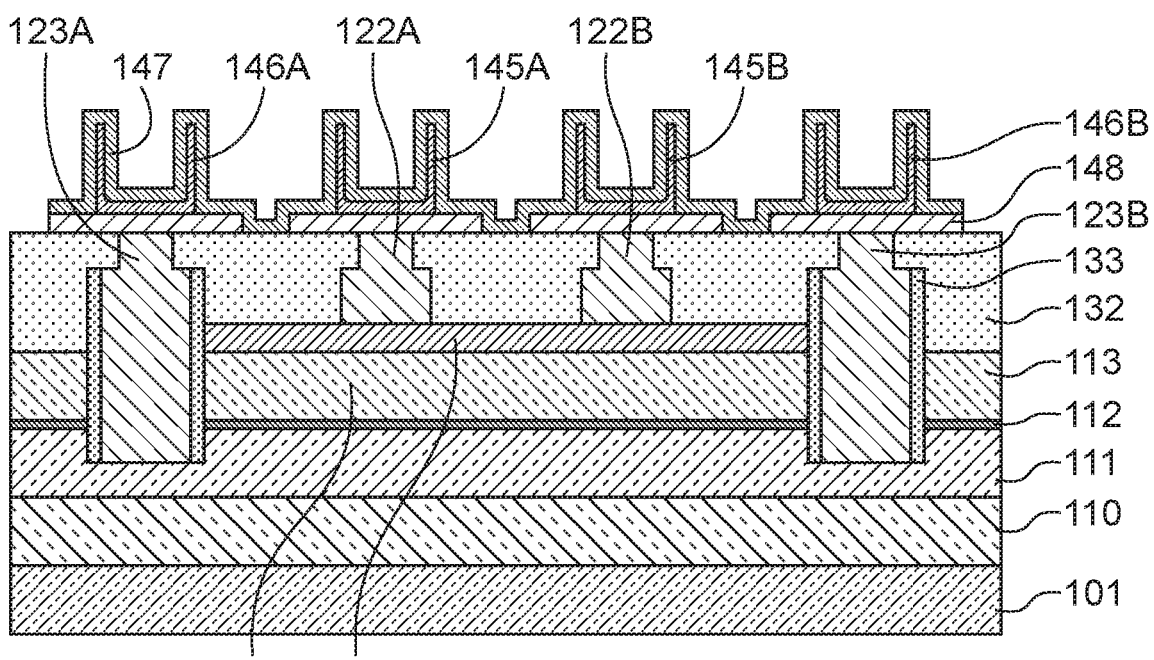
FIG. 7 is a sectional view of a sixth step in a method of fabrication of the structure in FIG. 1.
Figure 8:
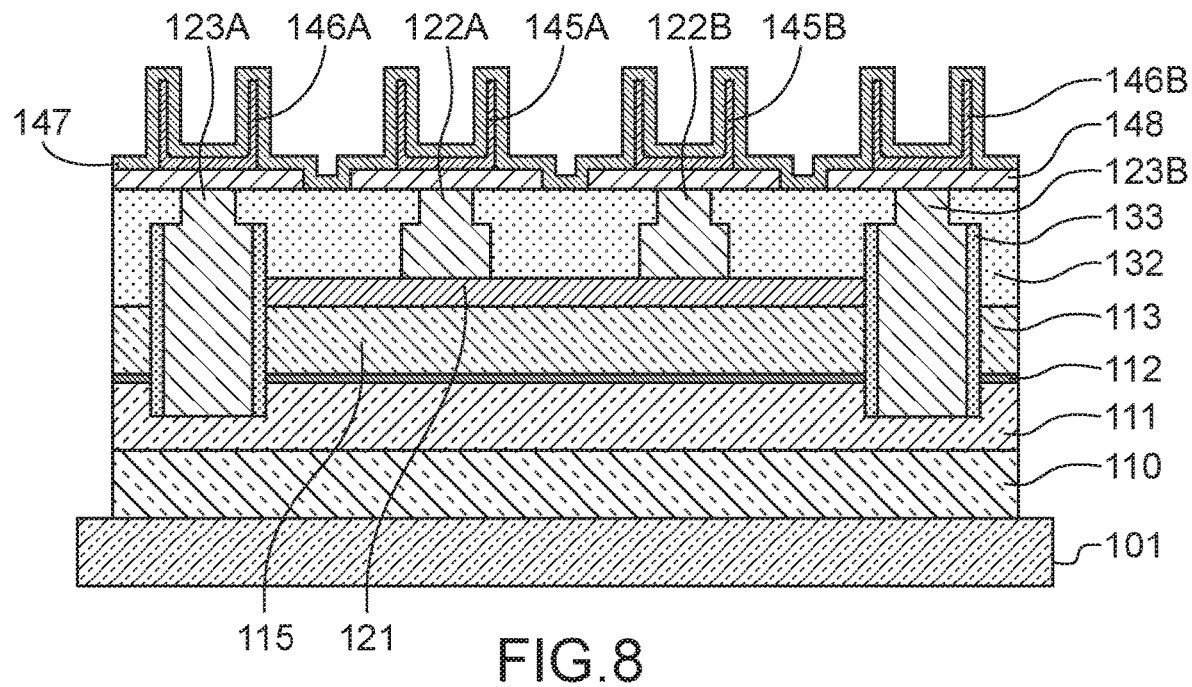
FIG. 8 is a sectional view of a seventh step in a method of fabrication of the structure in FIG. 1.
Figure 9:
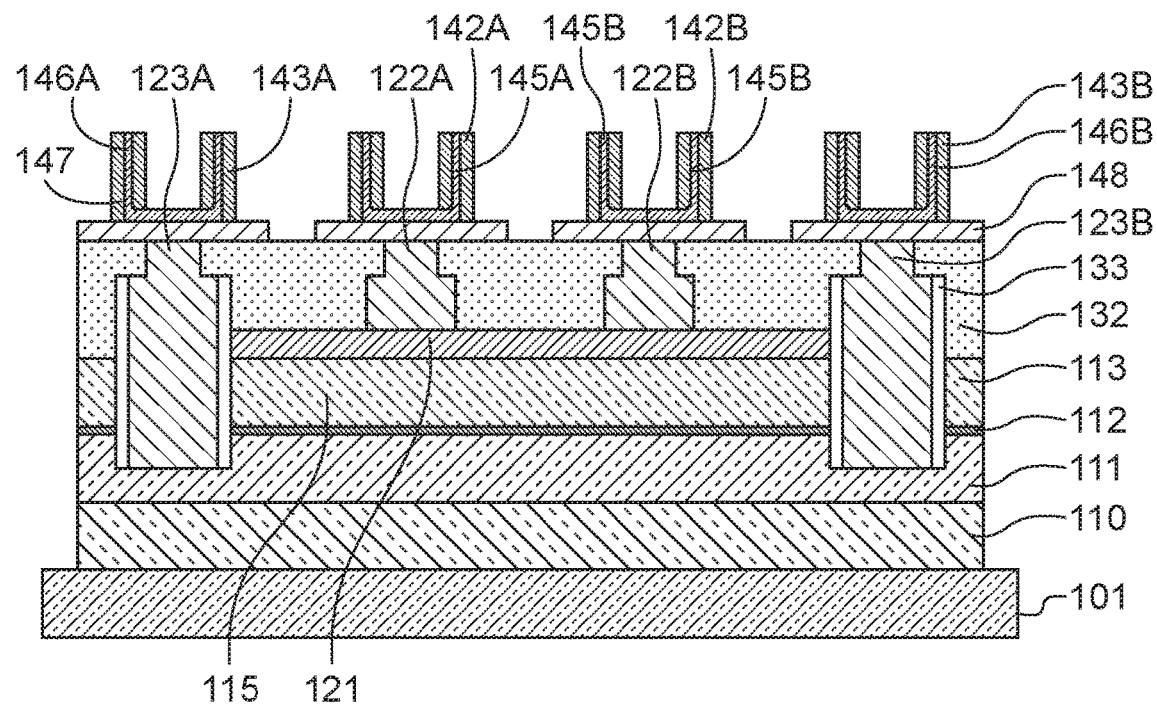
FIG. 9 is a sectional view of an eighth step in a method of fabrication of the structure in FIG. 1.

The semiconducting structure 100 according to the invention can be formed using a fabrication method illustrated on FIGS. 2 to 9 and comprising the following steps:

supply a first support 101, 110, 111, 112, 113, 121, 131 comprising the substrate 101 and an active layer 111, 112, 113, the active layer comprising a nitrided semiconductor, the active region 115 of the semiconducting structure 100 and at least one first and one second connection zone of said active region 115 that is flush with a surface of the first support 101, 110, 111, 112, 113, 121, 131 being arranged in said active layer 111, 112, 113, the steps in said supply being illustrated on FIGS. 2 to 5, formation of first and second insert bodies 145A, 145B, 146A, 146B in electrical contact with the first and second connection zones respectively, said formation step comprising formation of the nickel layer 147 covering a portion of the surface of the first support 101, 110, 111, 112, 113, 121, 131, said nickel layer 147 being arranged on the support surface 101, 110, 111, 112, 113, 121, 131 at the active region 115, at least partially covering the connection zones, the steps of said formation being illustrated on FIGS. 5 to 7, local physico-chemical etching of the active layer 111, 112, 113, a part of the active layer 111, 112, 113 comprising the active region 115 being protected by the nickel layer 147, as illustrated on FIG. 8, physico-chemical etching of the nickel layer 147, the etching being stopped after the release of at least part of the surface of the first support 101, 110, 111, 112, 113, 121, 131 of said nickel layer 147, the part of the surface of the first support 101, 110, 111, 112, 113, 121, 131 including the surface of the first support 101, 110, 111, 112, 113, 121, 131 outside the first and second connection zones, a remaining portion of the nickel layer 147 and each of the first and second insert bodies 145A, 145B, 146A, 146B being used for formation of the first and second inserts 142A, 142B, 143A, 143B, as illustrated on FIG. 9, release of the active layer 111, 112, 113 from the first substrate 101, said release forming the semiconducting structure 100, in compliance with the semiconducting structure 100 illustrated on FIG. 1.

Thus, during the localised etching step of the active layer 111, 112, 113 used to singularise the semiconducting structure 100, the nickel layer 147 participating in formation of the inserts 142A, 142B, 143A, 143B, is used as the etching mask. Therefore this localised etching to singularise the structure is aligned with elements forming the inserts 142A, 142B, 143A, 143B and therefore the inserts 142A, 142B, 143A, 143B themselves. Therefore it is possible to minimise the size of the semiconducting structure and have a good alignment between the structure 100 and its inserts 142A, 142B, 143A, 143B that will be used to connect it to the second support 200.

The first step to supply the first support 101, 110, 111, 112, 113, 121, 131 may include the following sub-steps:

supply the first substrate 101, this first substrate 101 possibly being a first substrate 101 made of silicon Si, in the framework of the preferred application, deposit the adaptation layer 110 in contact with the first substrate, the adaptation layer 110 being a layer of gallium nitride GaN, in the framework of the preferred application, deposit the first sub-layer 111 in contact with the adaptation layer 110, the first sub-layer 111 being a layer of gallium nitride GaN with the first type of conductivity, in the framework of the preferred application, formation of the active zone 112, in contact with the first sub-layer 111, said active zone 112 comprising at least one quantum well, in the framework of the preferred application, deposit the second active sub-layer 113 in contact with the active zone 112, the second sub-layer 113 being a layer of gallium nitride GaN with the second type of conductivity, in the framework of the preferred application, deposit the first metallic layer 121 in contact with the second active sub-layer 113, the first metallic layer 121 being a layer of titanium nitride TiN, in the framework of the preferred application, deposit a sacrificial insulating layer 131 in contact with the first metallic layer 121, the first metallic layer-layer 121 being a layer of sodium dioxide $SiO_2$ or silicon nitride $Si_2N_3$, in the framework of the preferred application, local etching of the sacrificial insulating layer 131 and the first metallic layer 121 so as to release a second portion of the second active sub-layer 113, as illustrated in FIG. 2, removal of the sacrificial insulating layer 131, deposition of a first part of the insulating layer 132, said deposition being followed by a step to planarise the insulating layer 132, formation of a first and a second opening 310A, 310B through the insulating layer 132, the second active sub-layer 113, the active zone 112, and part of the first active sub-layer 111, said first and second openings 310A, 310B opening up in the first active layer, deposition of the insulating coating 133 in contact with the first support 101, 110, 111, 112, 113, 121, 131, the insulating coating 133 being deposited in particular in contact with the lateral walls of the first and second openings 310A, 310B, said insulating coating 133 being made of alumina $Al_2O_3$, in the framework of the preferred application, isotropic etching of the insulating coating 133 so as to release the surface of the first support 101, 110, 111, 112, 113, 121, 131 and the bottom of the first and second openings 310A, as illustrated on FIG. 3, formation of a third and a fourth opening through the insulating layer 132, said third and fourth openings 310A, 310B opening up in the first metallic layer 121, deposition of a metallic material so as to fill the first, second, third and fourth openings 310A, 310B, the deposition being followed by a planarisation step so as to release the insulating layer 132 of metallic material, said metallic material being a first bond layer of titanium Ti/titanium nitride TiN and a copper core Cu, as illustrated on FIG. 4, in the framework of the preferred application, deposition of a second part of the insulating layer 132 in contact with the first part of the insulating layer 132, formation of a fifth, sixth, seventh and eight opening in the prolongation of the first, second, third and fourth openings 310A, 310B respectively and opening up in said opening 310A, 310B, these openings having smaller dimensions than the first, second third and fourth openings 310A, 310B, deposition of a metallic material so as to fill the fifth, sixth, seventh and eight openings 310A, 310B, the deposition being followed by a planarisation step so as to release the insulating layer 132 of metallic material, said metallic material being a first bond layer of titanium Ti/titanium nitride TiN and a copper core Cu, the first support 101, 110, 111, 112, 113, 121, 131 being thus formed as illustrated on FIG. 5, in the framework of the preferred application.

The step for formation of the first and second insert bodies 145A, 145B, 146A, 146B in electrical contact with the first and second connection zones respectively may include the following sub-steps:

deposit the second metallic layer 148 in contact with the surface of the first support 101, 110, 111, 112, 113, 121, 131, said second metallic layer 148 being a layer of titanium nitride TiN, in the framework of the preferred application, localised etching of the second metallic layer 148 so as to release part of the surface of the first support 101, 110, 111, 112, 113, 121, 131, and thus form a portion of metallic layer 148 in contact with each of the first and second first connection zones and the first and second second connection zones, formation of a mask of photosensitive resin 320 in contact with the second metallic layer 148 and the part of the surface of the first support 101, 110, 111, 112, 113, 121, 131 free of the metallic layer 148, said resin mask being provided with a first and second first opening 322A, 322B opening up on the portion of second metallic layer 148 in contact with the first and second first connection zones and first and second second openings 323A, 323B opening up on the portions of second metallic layer 148 in contact with the first and second second connection zones and being a polymer resin such as a polyamide, in the framework of the preferred application, deposition of a layer of the material(s) that will form the insert bodies 145A, 145B, 146A, 146B in contact with the surface of the resin mask, walls of the first and second first openings 322A, 322A, walls of the first and second second openings 323A, 323B and portions of second metallic layer 148 free of the photosensitive resin mask 220, this deposition consisting of a successive deposition of Ti, titanium nitride TiN and silicon carbide WSi, in the framework of the preferred application, the deposition being followed by a planarisation step so as to release the surface of the resin mask of the layer of material(s) that will form the insert bodies 145A, 145B, 146A, 146B, the first and second first insert bodies 145A, 145B and the first and second second insert bodies 146A, 146B being formed in this way, as illustrated on FIG. 6, elimination of the mask made of a photosensitive resin 320, deposition of nickel Ni so as to form the nickel layer 147 in contact with the first and second first insert bodies 145A, 145B, the first and second second insert bodies 146A, 146B, the portions of second metallic layer 148 that is free of insert bodies 145A, 145B, 146A, 146B and parts of the surface of the first support 101, 110, 111, 112, 113, 121, 131 that is free of portions of second metallic layer 148, local etching of the nickel layer 147 such that the remaining part of the nickel layer 147 covers a portion of the surface of the first support 101, 110, 111, 112, 113, 121, 131, said nickel layer 147 being arranged on the support surface 101, 110, 111, 112, 113, 121, 131 in the active region 115, at least partially covering the connection zones, said etching being a physico-chemical etching such as ion etching, the localisation being provided by the use of an appropriate mask removed after etching, as illustrated on FIG. 7.

During the localised physico-chemical etching step of the active layer 111, 112, 113 and in the framework of the preferred application, physico-chemical etching can be chlorine plasma etching, as illustrated on FIG. 8.

During the etching step of the nickel layer 147 and in the framework of the preferred application, physico-chemical etching can be ion etching.

The semiconducting structure 100 thus formed is adapted to be connected to the second support 200 so as to form the semiconducting device 10 according to the invention. Such a connection can be made by means of method of assembly by hybridisation including the following step:

connection of the first and second connection zones with the third and fourth connection zones 222A, 222B, 223A, 223B respectively by insertion of the first and second inserts 142A, 142B, 143A, 143B in the first and second bumps made of a ductile conducting material 242A, 242B, 243A, 243B, respectively.

Figure 10:
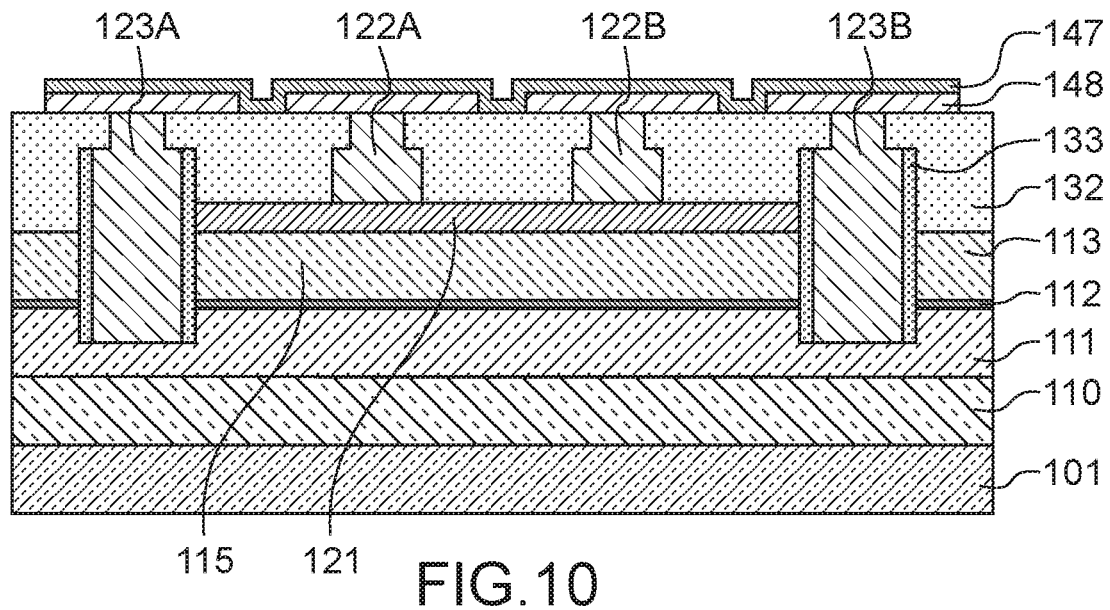
FIG. 10 is a sectional view of a first step in a method of fabrication of a structure according to a second embodiment of the invention.
Figure 11:
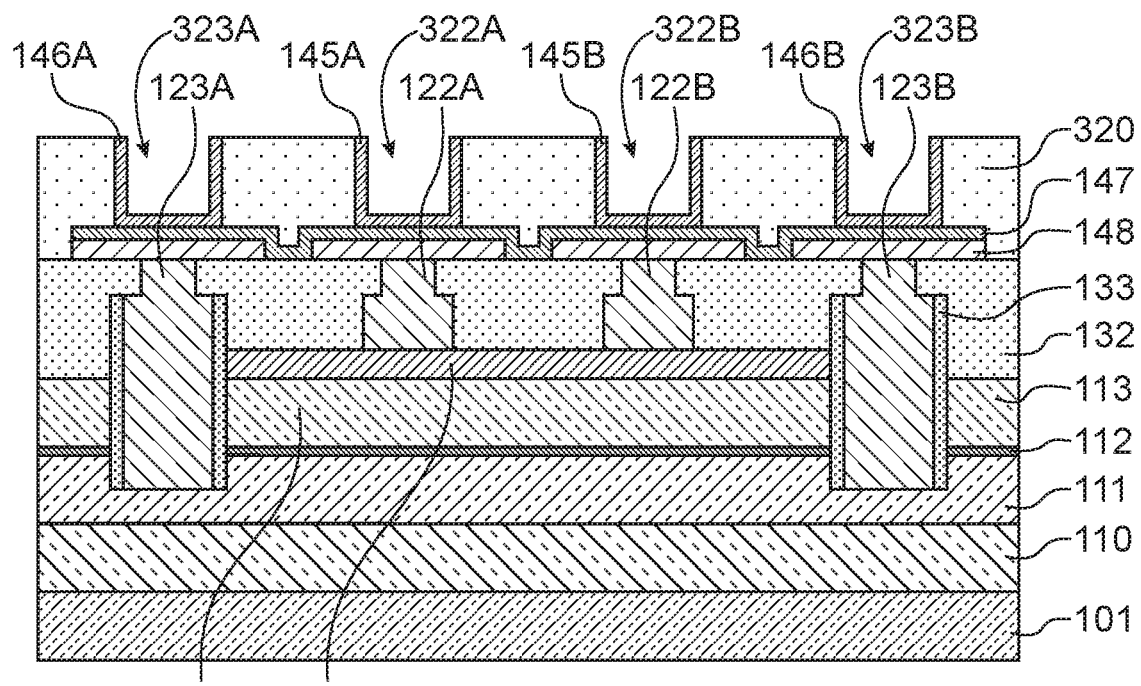
FIG. 11 is a sectional view of a second step in a method of fabrication of a structure according to a second embodiment of the invention.
Figure 12:
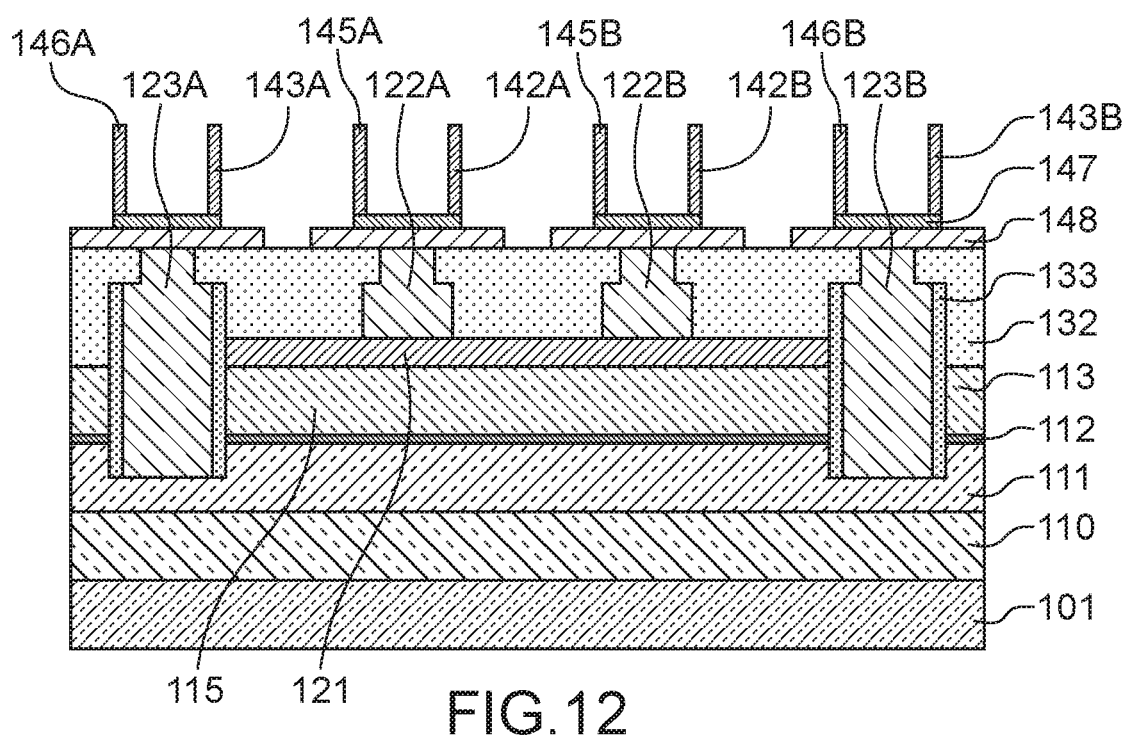
FIG. 12 is a sectional view of a third step in a method of fabrication of a structure according to a second embodiment of the invention, Identical, similar or equivalent parts of the different figures have the same numeric references to facilitate the comparison between the different figures.

FIGS. 10 to 12 illustrate the steps in a method of fabricating a semiconducting structure according to a second embodiment. A fabrication method according to this second embodiment is different from a method according to the first embodiment in that the step to deposit the nickel layer 147 takes place before formation of a photosensitive resin mask 220.

Thus with a fabrication method according to this second embodiment, the step for formation of at least a first and a second insert body 145A, 145B, 146A, 146B in electrical contact with the first and second connection zones respectively may include the following sub-steps, after the localised etching sub-step of the second metallic layer 148 so as to release part of the surface of the first support 101, 110, 111, 112, 113, 121, 131:

deposition of nickel Ni so as to form the nickel layer 147 in contact with portions of the second metallic layer 148, and parts of the surface of the first support 101, 110, 111, 112, 113, 121, 131 that is free of portions of the second metallic layer 148, local etching of the nickel layer 147 such that the remaining part of the nickel layer 147 covers a portion of the surface of the first support 101, 110, 111, 112, 113, 121, 131, said nickel layer 147 being arranged on the support surface 101, 110, 111, 112, 113, 121, 131 in the active region 115, at least partially covering the connection zones, said etching being a physico-chemical etching such as ion etching, the localisation being provided by the use of an appropriate mask removed after etching, as illustrated on FIG. 10, formation of a mask of photosensitive resin 320 in contact with the nickel layer 147 and the part of the surface of the first support 101, 110, 111, 112, 113, 121, 131 free of the nickel layer 147, said resin mask being provided with a first and second first opening 322A, 322B opening up on the nickel layer 147 at the first and second first connection zones and a first and second opening 323A, 323B opening up on the nickel layer 147 at the first and second second connection zones and being a polymer resin such as a polyamide, in the framework of the preferred application, deposition of a layer of the material(s) that will form the insert bodies 145A, 145B, 146A, 146B in contact with the surface of the resin mask, walls of the first and second first openings 322A, 322A, walls of the first and second second openings 323A, 323B and portions of the nickel layer 147 that is free of the photosensitive resin mask 220, this deposition consisting of a successive deposition of titanium Ti, titanium nitride TiN and nickel, in the framework of the preferred application, the deposition being followed by a planarisation step so as to release the surface of the resin mask of the layer of material(s) that will form the insert bodies 145A, 145B, 146A, 146B, the first and second first insert bodies 145A, 145B and the first and second second insert bodies 145A, 145B being formed in this way, as illustrated on FIG. 11, elimination of the photosensitive resin mask 320, as illustrated on FIG. 12.

It will be noted that in accordance with the preferred application described above, each of the insert bodies 145A, 145B, 146A, 146B preferably contains nickel Ni, so as to limit the part of each of the insert bodies 145A, 145B, 146A, 146B etched during the localised physico-chemical etching steps of the active layer 147.

Thus, the insert bodies 145A, 145B, 146A, 146B are only slightly etched or are not etched during the localised physico-chemical etching step of the active layer 111, 112, 113 and anisotropically etched during the physico-chemical etching step of the nickel layer 147. As shown on FIG. 12, this anisotropic etching leads to etching of the part of insert bodies 145A, 145B, 146A, 146B at the base and the vertex of the cylindrical shape, the part of the nickel layer 147 protected by said base then forming the base of the insert 142A, 142B, 143A, 143B formed after said etching.

In compliance with this possibility, it will be noted that a semiconducting structure 100 according to this second embodiment is different from a semiconducting structure according to the first embodiment in that, for each of the first and second first inserts 142A, 142B, 143A, 143B:

the insert body 145A, 145B is in the form of a hollow cylinder without a base, the nickel layer 147 forms the base of the insert body 145A, 145B, 146A, 146B in contact with the corresponding portion of second metallic layer 148, said nickel layer not coating the lateral walls of the insert body 145A, 145B, 146A, 146B.

The invention claimed is:

1. Method of fabrication of a semiconducting structure intended to be connected by hybridisation to a second support, the method for fabricating a semiconducting structure including the following steps:

supply a first support that comprises a substrate and at least one active layer, said active layer comprising at least one nitrided semiconducting material, at least one active region of said semiconducting structure and at least one first connection zone and at least one second connection zone of said active region being arranged in said active layer, the first connection zone and the second connection zone of said active region flush with a surface of the first support, formation of at least one first insert body and one second insert body in electrical contact with the first and second connection zones respectively, said formation step comprising formation of a nickel layer covering a portion of the surface of the first support, said nickel layer being arranged on the support surface at the active region, at least partially covering the first and second connection zones, localised physico-chemical etching of the active layer, the localisation of the etching being provided by protecting a part of the active layer comprising the active region by the nickel layer, physico-chemical etching of the nickel layer, the etching being stopped after the release of at least part of the surface of the first support of said nickel layer, the part of the surface of the first support including the surface of the first support outside the first and second connection zones, a remaining portion of the nickel layer and each of the first insert body and second insert body being used for formation of a first insert and a second insert, release of the active layer from the first substrate, the release enabling formation of the semiconducting structure.

2. The method of fabrication according to claim 1, wherein the step for formation of the first insert and second inserts includes the following sub-steps:

formation of at least a first metallic layer portion and a second metallic layer portion of a metallic layer covering the first connection zone and second connection zone respectively, formation of a first insert body and a second insert body in contact with the first metallic layer portion and the second metallic layer portion, respectively, deposition of the nickel layer in contact with the support surface, with the first portion of metallic layer and second portions of metallic layer, and with the first insert body and second insert body, the nickel layer forming a coating of the first insert body and second insert body.

3. The method of fabrication according to claim 1, wherein the step for formation of the first insert body and second insert body includes the following sub-steps:

formation of at least a first portion of the metallic layer and a second portion of the metallic layer covering the first connection zone and second connection zone respectively, deposition of the nickel layer covering the support surface that is free of the first metallic layer portion and of the second metallic layer portion, and said first and second metallic layer portions, formation of a first insert body and a second insert body in contact with the nickel layer at the first metallic layer portion and second metallic layer portion, respectively.

4. The method of fabrication according to claim 3, wherein the first insert body and second insert bodies comprise nickel.

5. The method of fabrication according to claim 1, wherein the first insert body and second insert bodies include a carbide from among silicon carbide and tungsten carbide.

6. The method of fabrication according to claim 1, wherein the active layer comprises gallium nitride.

7. The method of fabrication according to claim 1, wherein the active part of the semiconducting structure is a diode, the first connection zone and second connection zone corresponding to the metallic contacts of the anode and cathode of said diode, respectively.

8. The method of fabrication of a semiconducting structure according to claim 7, wherein the active layer comprises:

a first active sub-layer with a first type of conductivity, the second connection zone being a connection zone of said first active sub-layer, an active zone adapted to emit light, said active zone, a second active sub-layer with a second type of conductivity opposite the first type of conductivity, the first connection zone being a connection zone of said second active sub-layer.

9. Method of fabrication of a semiconducting device comprising a semiconducting structure, the method including the following steps:

formation of a semiconducting structure using a fabrication method according to claim 1, supply of a second support comprising at least a third connection zone and a fourth connection zone corresponding to the first connection zone and to the second connection zone of the semiconducting structure, and a first bump and second bump made of a ductile conducting material in electrical contact with the third connection zone and the fourth connection zones respectively, connection of the first connection zone and second connection zone with the third and fourth connection zones respectively by insertion of the first insert and second insert in the first bump and second bump made of a ductile conducting material, respectively.

10. The method of fabrication of a device according to claim 9, wherein the semiconducting structure is a light emitting diode, the second support comprising a control circuit adapted to supply and control said light emitting diode.

\* \* \* \* \*